US012644958B2

(12) United States Patent
Sridharan et al.

(10) Patent No.: US 12,644,958 B2
(45) Date of Patent: Jun. 2, 2026

(54) METALIZED PLASTIC HOUSING ENCLOSURE HEAT SINK

(71) Applicant: APTIV TECHNOLOGIES LIMITED, St. Michael (BB)

(72) Inventors: Kesav Kumar Sridharan, Bengaluru (IN); Navneet Gupta, Karnataka (IN); Scott Brandenburg, Kokomo, IN (US); David Zimmerman, Noblesville, IN (US)

(73) Assignee: Aptiv Technologies AG, Schaffhausen (CH)

( * ) Notice: Subject to any disclaimer, the term of this patent is extended or adjusted under 35 U.S.C. 154(b) by 447 days.

(21) Appl. No.: 17/876,799

(22) Filed: Jul. 29, 2022

(65) Prior Publication Data

US 2023/0408636 A1     Dec. 21, 2023

(30) Foreign Application Priority Data

Jun. 16, 2022     (IN) .............................. 202241034436

(51) Int. Cl.
| | |
|---|---|
| *G01S 7/02* | (2006.01) |
| *B29C 45/14* | (2006.01) |
| *G01S 13/931* | (2020.01) |
| *H05K 7/20* | (2006.01) |
| *B29L 31/34* | (2006.01) |

(52) U.S. Cl.
CPC ........ *G01S 7/027* (2021.05); *B29C 45/14467* (2013.01); *B29C 45/14778* (2013.01); *G01S 13/931* (2013.01); *H05K 7/20854* (2013.01); *B29K 2995/0013* (2013.01); *B29L 2031/3481* (2013.01)

(58) Field of Classification Search
None
See application file for complete search history.

(56) References Cited

U.S. PATENT DOCUMENTS

| | | | | |
|---|---|---|---|---|
| 7,361,985 B2 * | 4/2008 | Yuan | ................... | H01L 23/3128 257/713 |
| 2019/0153179 A1 * | 5/2019 | Grinsteinner | ............ | H05K 5/03 |
| 2019/0159371 A1 * | 5/2019 | Grinsteinner | ......... | G01S 7/4813 |
| 2019/0229410 A1 * | 7/2019 | Hung | ..................... | H01Q 1/421 |
| 2020/0008291 A1 * | 1/2020 | Brandenburg | ...... | H01L 23/3733 |
| 2020/0350670 A1 * | 11/2020 | Beer | ...................... | G01S 7/027 |

(Continued)

FOREIGN PATENT DOCUMENTS

DE     102018206290 B3     6/2019

OTHER PUBLICATIONS

Extended European Search Report for EP Application No. 23179255. 7, 10 pages Nov. 2, 2023.

(Continued)

*Primary Examiner* — Marcus E Windrich
(74) *Attorney, Agent, or Firm* — Miller Johnson

(57) ABSTRACT

Thermal management and shielding techniques for a radar device of a vehicle, the radar device having a radar transceiver circuit and a radar-transmissive radome, include a housing formed of a thermally-conductive plastic material and configured to receive and provide shield grounding to the radar transceiver circuit, and a metal layer applied to an inner surface of the housing to provide for thermal spreading of heat energy generated by the radar transceiver circuit.

18 Claims, 3 Drawing Sheets

(56)          References Cited

U.S. PATENT DOCUMENTS

| 2021/0043541 | A1* | 2/2021 | Eid | ......................... | H01L 23/42 |
| 2021/0410344 | A1 | 12/2021 | Kim | | |
| 2022/0087006 | A1* | 3/2022 | Brandenburg | ....... | H05K 1/0209 |
| 2022/0248573 | A1* | 8/2022 | Wang | ................... | H05K 9/0022 |

OTHER PUBLICATIONS

Office Action received for EP Application No. 23179255.7, 8 pages Mar. 27, 2025.

* cited by examiner

200

Start

Form/Provide Thermally-Conductive Plastic Housing — 204

Apply Metal Layer to Inner Surface of Housing — 208

Provide/Insert Radar Transceiver Circuit Within Housing — 212

Provide/Cover With Radome to Obtain Vehicle Radar Device — 216

End/Return

300

Start

Provide Radar Transceiver Circuit —304

Provide Radar-Transmissive Radome —308

Form Thermally-Conductive Plastic Housing —312

Apply Metal Layer to Inner Surface of Housing —316

Insert Radar Transceiver Circuit Within Housing —320

Cover With Radome to Assemble/ Package Vehicle Radar Device —324

End/Return

METALIZED PLASTIC HOUSING ENCLOSURE HEAT SINK

CROSS-REFERENCE TO RELATED APPLICATION(S)

The present application claims the benefit of Indian Patent Application Number 202241034436, filed on Jun. 16, 2022. The disclosure of the above-identified application is hereby incorporated by reference in its entirety.

FIELD

The present disclosure generally relates to radar devices and, more particularly, a metalized plastic housing enclosure heat sink for a vehicle radar device.

BACKGROUND

Today's vehicles often include one or more radar devices, each of which typically includes a radar transceiver circuit positioned behind a protective, transmissive radome or similar structure. Aluminum die cast inserts are traditionally used for thermal management and shielding of the radar transceiver circuit. The die cast insert is not thermally connected to a traditional non-thermally conductive plastic case. Conductive adhesive is therefore typically applied for shield grounding to the radar transceiver circuit, such as a printed circuit board (PCB). These conventional solutions suffer from poor thermal dispersing and spreading and poor thermal energy removal from the radar transceiver circuit. Aluminum die cast inserts are also relatively expensive and additional required pedestals could increase overall size/packaging. Thus, while these conventional thermal management and shielding solutions for vehicle radar devices do work for their intended purpose, there exists an opportunity for improvement in the relevant art.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

According to one aspect of the present disclosure, a thermal management and shielding system for a radar device of a vehicle, the radar device having a radar transceiver circuit and a radar-transmissive radome, is presented. In one exemplary implementation, the thermal management and shielding system comprises a housing formed of a thermally-conductive plastic material and configured to receive and provide shield grounding to the radar transceiver circuit, and a metal layer applied to an inner surface of the housing to provide for thermal spreading of heat energy generated by the radar transceiver circuit.

In some implementations, the metal layer comprises (i) copper, (ii) nickel, and (iii) silver or aluminum. In some implementations, the metal layer is a metalized film that is applied via a film deposition technique. In some implementations, the metal layer is formed by (i) plating copper, followed by (ii) plating nickel, followed by (iii) vapor deposition of silver or aluminum. In some implementations, the metal layer defines 1-10 microns of copper, 0.25 to 2.5 microns of nickel, and 1.0 micron of silver or aluminum. In some implementations, the thermally-conductive plastic material defines k-values of 15 watts per meter-Kelvin (W/mK) for in-plane (x/y axis) conductivity and 3.5 W/mK for out-plane/thickness (z-axis) conductivity.

In some implementations, the housing is an injection molded housing formed by injection molding of the thermally-conductive plastic material in a mold defined (i) based on a surface topography of the radar transceiver circuit and (ii) to create a set of features for a mechanical bond of at least a perimeter of the radar transceiver circuit to the thermally-conductive housing via the metal layer. In some implementations, the mold is further defined to create at least one of one or more pressure points in the housing to increase flexibility and improve electrical contact with the radar transceiver circuit, and one or more dimples spaced apart from each other for shielding around the radar transceiver circuit. In some implementations, a force applied during packaging of the radar transceiver circuit in the housing and then covered by the radome forms a seal thereby sealing the radar transceiver circuit therein.

According to another aspect of the present disclosure, a thermal management and shielding method for a radar device of a vehicle, the radar device having a radar transceiver circuit and a radar-transmissive radome, is presented. In one exemplary implementation, the thermal management and shielding method comprises providing a housing formed of a thermally-conductive plastic material and configured to receive and provide shield grounding to the radar transceiver circuit, and applying a metal layer to an inner surface of the housing to provide for thermal spreading of heat energy generated by the radar transceiver circuit.

In some implementations, the metal layer comprises (i) copper, (ii) nickel, and (iii) silver or aluminum. In some implementations, the metal layer is a metalized film, and further comprising applying the metalized film via a film deposition technique. In some implementations, the metal layer is formed by (i) plating copper, followed by (ii) plating nickel, followed by (iii) vapor deposition of silver or aluminum. In some implementations, the metal layer defines 1-10 microns of copper, 0.25 to 2.5 microns of nickel, and 1.0 micron of silver or aluminum. In some implementations, the thermally-conductive plastic material defines k-values of 15 watts per meter-Kelvin (W/mK) for in-plane (x/y axis) conductivity and 3.5 W/mK for out-plane/thickness (z-axis) conductivity.

In some implementations, the housing is an injection molded housing, and further comprising injection molding the thermally-conductive plastic material in a mold to form the housing, wherein the mold is defined (i) based on a surface topography of the radar transceiver circuit and (ii) to create a set of features for a mechanical bond of at least a perimeter of the radar transceiver circuit to the thermally-conductive housing via the metal layer. In some implementations, the mold is further defined to create at least one of one or more pressure points in the housing to increase flexibility and improve electrical contact with the radar transceiver circuit, and one or more dimples spaced apart from each other for shielding around the radar transceiver circuit. In some implementations, a force applied during packaging of the radar transceiver circuit in the housing and then covered by the radome forms a seal thereby sealing the radar transceiver circuit therein.

According to yet another aspect of the present disclosure, a method of manufacturing and assembling a radar device for a vehicle is presented. In one exemplary implementation, the method comprises providing a radar transceiver circuit defining a surface topography and a perimeter, providing a radar-transmissive radome configured to protect the radar-transceiver circuit, injection molding a thermally-conductive plastic material in a mold to form a housing configured to receive the radar transceiver circuit and to provide shield grounding thereto, wherein the mold is defined (i) based on the surface topography of the radar transceiver circuit, (ii) to create a set of features for a mechanical bond of at least a perimeter of the radar transceiver circuit to the thermally-conductive housing, and (iii) to create at least one of (a) one or more pressure points in the housing to increase flexibility and improve electrical contact with the radar transceiver circuit and (b) one or more dimples spaced apart from each other for shielding around the radar transceiver circuit, applying a metal layer to an inner surface of the housing to provide for thermal spreading of heat energy generated by the radar transceiver circuit, wherein the metal layer is formed by (i) plating copper, followed by (ii) plating nickel, followed by (iii) vapor deposition of silver or aluminum, and assembling/packaging the radar transceiver circuit within the housing and then covering with the radome to form the radar device, wherein the assembling/packaging includes applying a force to sealing the radar transceiver circuit therein and is performed by a human assembler, a robotic assembler, or a combination thereof.

In some implementations, the thermally-conductive plastic material defines k-values of 15 watts per meter-Kelvin (W/mK) for in-plane (x/y axis) conductivity and 3.5 W/mK for out-plane/thickness (z-axis) conductivity, and the metal layer defines 1-10 microns of copper, 0.25 to 2.5 microns of nickel, and 1.0 micron of silver or aluminum.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Vehicle or automotive radar devices (e.g., 24 GHz or 77 GHz) are often used for various advanced driver-assistance system (ADAS) and autonomous driving features, such as, but not limited to, lane keeping/centering, adaptive cruise control (ACC), and collision avoidance. One primary example of an automotive radar device is in a center of a front grille assembly behind a protective and radar-transmissive (e.g., radar-transparent) cover known as a radome, which could be, for example, behind or integrated into a vehicle emblem/logo. As previously discussed, conventional solutions for thermal management and shielding of radar transceiver circuits suffer from high costs (aluminum die casts, thermally conductive adhesives, additional pedestals, etc.) and poor performance (e.g., poor thermal spreading and ground shielding) that could potentially shorten device life. As a result, there exists an opportunity for improvement in the art of thermal management and shielding for vehicle radar devices.

Figure 1:
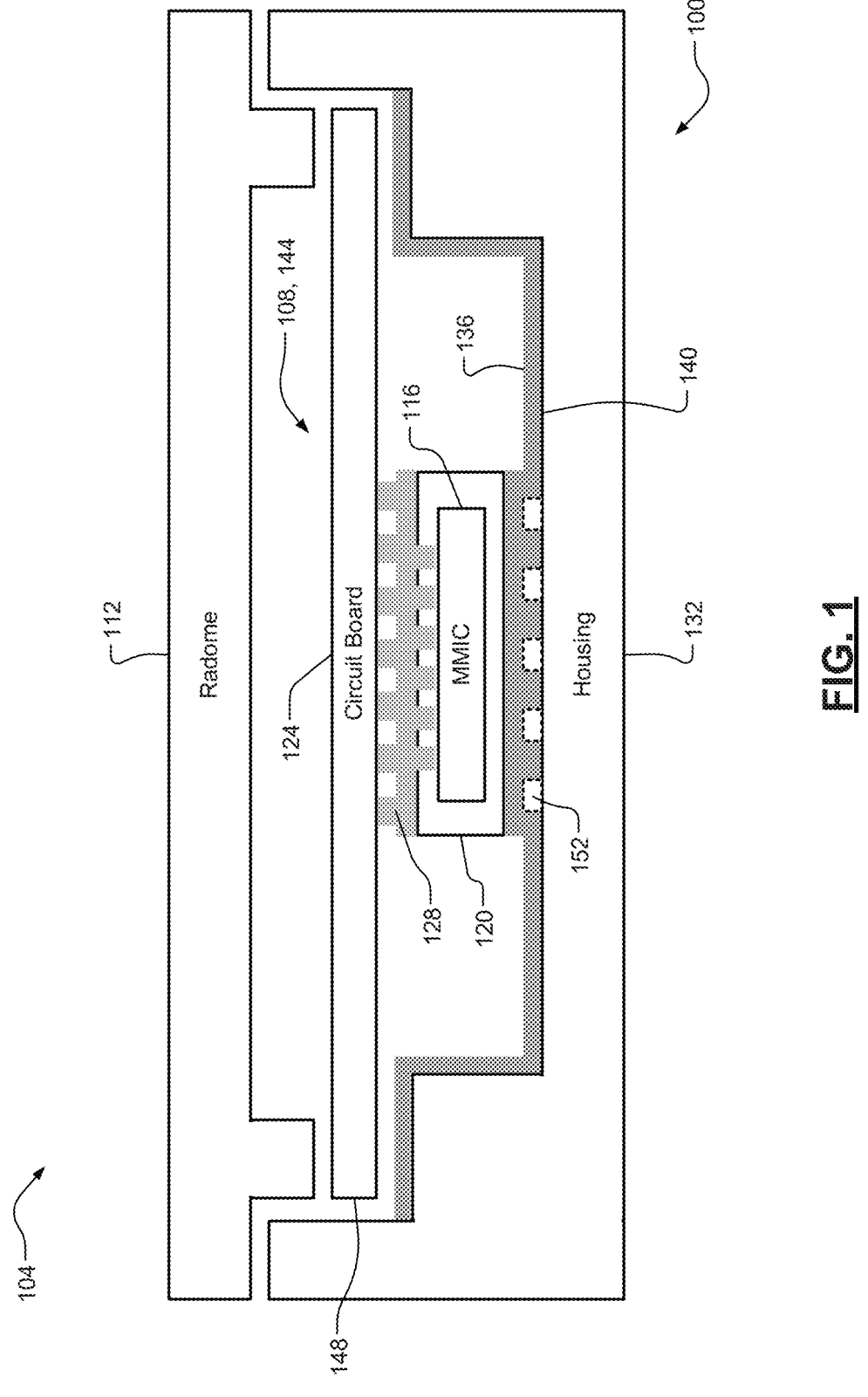
FIG. 1 is a cross-sectional or side view of an example thermal management and shielding system for a radar device of a vehicle according to some implementations of the present disclosure.

Referring now to FIG. 1, a cross-sectional or side view of a thermal management and shielding system 100 for a vehicle radar device 104 according to some implementations of the present disclosure is illustrated. The vehicle radar device 104 (also "radar device" or "radar device of a vehicle") generally comprises a radar transceiver circuit 108 configured to transmit and receive radio waves at desired frequencies through a radar-transmissive (e.g., radar-transparent) radome 112. In one exemplary implementation, the radar transceiver circuit 108 includes a monolithic microwave integrated circuit (MMIC) 116 having its own packaging/housing 120 and being electrically connected to a circuit board 124, such as a printed circuit board (PCB), via a set of electrical connections 128 (e.g., metal nibs or dimples). The radar device 104 also comprises some sort of packaging/housing, which for purposes of the present disclosure incorporates/integrates thermal management and shielding features that form the thermal management and shielding system 100. Specifically, the thermal management and shielding system 100 comprises (i) a housing 132 formed of a thermally-conductive plastic material and configured to receive the radar transceiver circuit 108 and provide ground shielding thereto and (ii) a metal layer 136 applied to an inner surface 140 of the housing 132 and configured to provide thermal management/dispersion of heat energy generated by the radar transceiver circuit 108.

In some implementations, the housing 132 is injection molded by injecting a thermally-conductive plastic material into a mold (not shown). While the mold is not specifically shown, the mold could define a cavity (i) based on a surface topography 144 of the radar transceiver circuit 108 and (ii) to create a set of features for a mechanical bond of at least a perimeter 148 of the radar transceiver circuit 108 to the thermally-conductive plastic housing 132 via the metal layer 136. In some implementations, the mold further defines (i) one or more pressure points (e.g., thinner regions/areas) in the housing 132 to increase flexibility and improve electrical contact with the radar transceiver circuit 108 and/or (ii) one or more dimples 152 spaced apart from each other for shielding around the radar transceiver circuit 108. The thermally-conductive plastic material can be selected to have or achieve a desired thermal conductivity or "k-value." This k-value may vary by axis depending on the shape of the housing 132. In one exemplary implementation, the thermally-conductive plastic material for the housing 132 defines k-values of approximately 15 watts per meter-Kelvin (W/mK) along x and y axes (i.e., in-plane conductivity) and approximately 3.5 WmK along a z-axis (i.e., out-plane or thickness conductivity). It will be appreciated that other k-value configurations could be used when different thermally-conductive plastic materials are used for desired/improved metrics, such as, for example only, higher k-values for in-plane (x/y axis) conductivity compared to out-plane/thickness (z-axis) conductivity, e.g., having higher isotropic properties greater than 3 W/mK.

The metal layer 136 generally comprises a plurality of different types of metal to provide or achieve a desired conductive performance for thermal management/dispersion of the heat energy generated by the radar transceiver circuit

108. In some implementations, the metal layer 136 consists of copper (Cu), nickel (Ni), and either silver (Ag) or aluminum (Al). The metal layer 136 could be formed using physical vapor deposition (PVD) techniques (e.g., sputtering), chemical vapor deposition (CVD) techniques, film application techniques, or some combination thereof. In some implementations, the metal layer 136 is formed by (i) plating copper, followed by (ii) plating nickel, followed by (iii) vapor deposition of silver or aluminum. In one exemplary implementation, the metal layer 136 defines approximately 1-10 micrometers (um, or microns) of copper, approximately 0.25 to 2.5 microns of nickel, and approximately 1.0 micron of silver or aluminum. It will be appreciated that other ranges and/or other combinations of metals could be used to achieve a desired performance goal or metric. In some implementations, the metal layer 136 is pre-formed as described above as a metalized film, and the metalized film is then applied to the inner surface 140 of the housing 132 using a film deposition technique (e.g., heat transfer).

Figure 2:
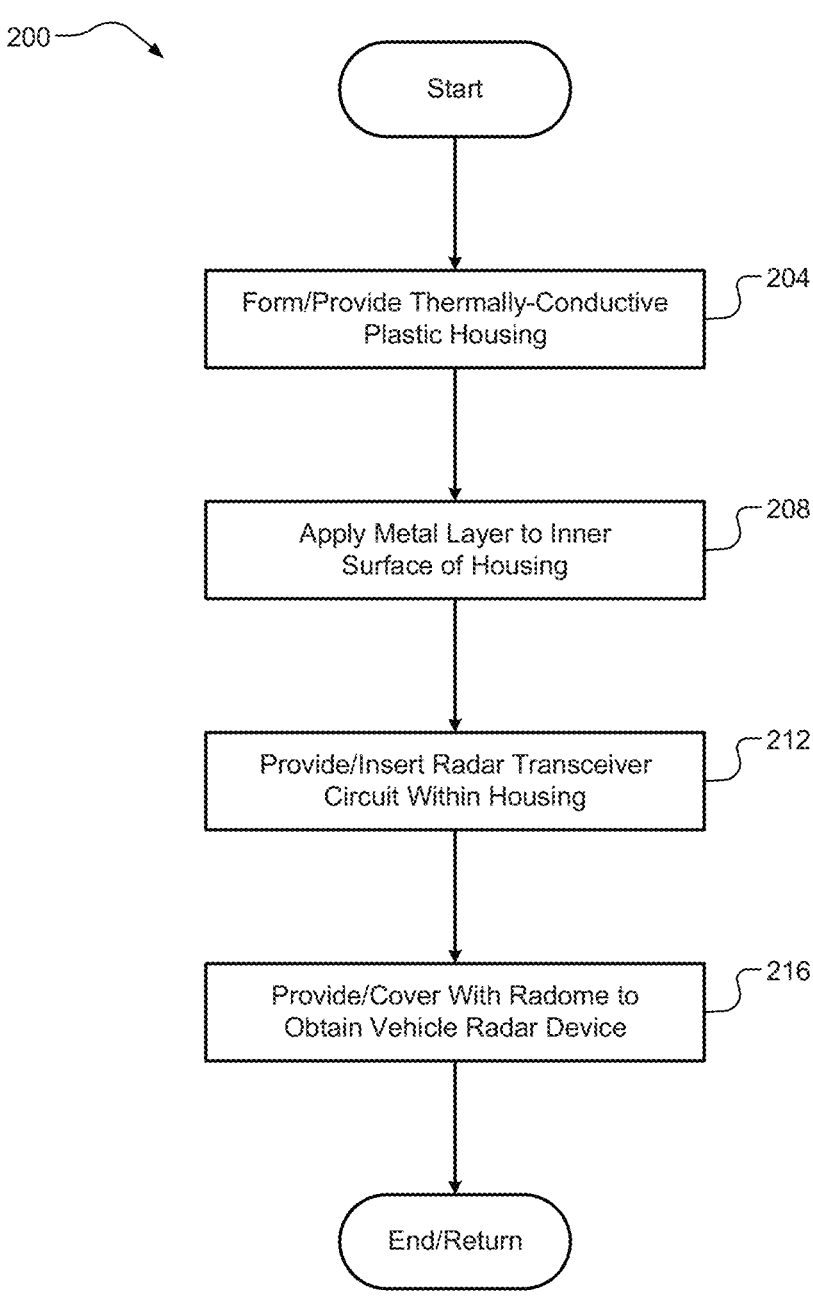
FIG. 2 is a flow diagram of an example method for providing thermal management and shielding for a vehicle radar device according to some implementations of the present disclosure.

Referring now to FIG. 2, a flow diagram of an example thermal management and shielding method 200 for a radar device of a vehicle according to some implementations of the present disclosure is illustrated. While the method 200 references the vehicle radar device 104 and its components for illustrative/explanatory purposes, it will be appreciated that the thermal management and shielding method 200 could be applicable to other suitable radar devices, including non-automotive radar devices (e.g., aviation, military, etc.). At 204, the thermally-conductive plastic housing 132 is formed and provided. At 208, the metal layer 136 is applied to the inner surface 136 of the housing 132. This could include, for example, a sequence of plating and vapor deposition of different metals as described herein. At 212, the radar transceiver circuit 108 is inserted or provided within the housing 132. Finally, at 216, the radome 116 is provided to cover the radar transceiver circuit 108 and complete the final part—the vehicle radar device 104. The method 200 then ends or returns to 204 for one or more additional method cycles.

Figure 3:
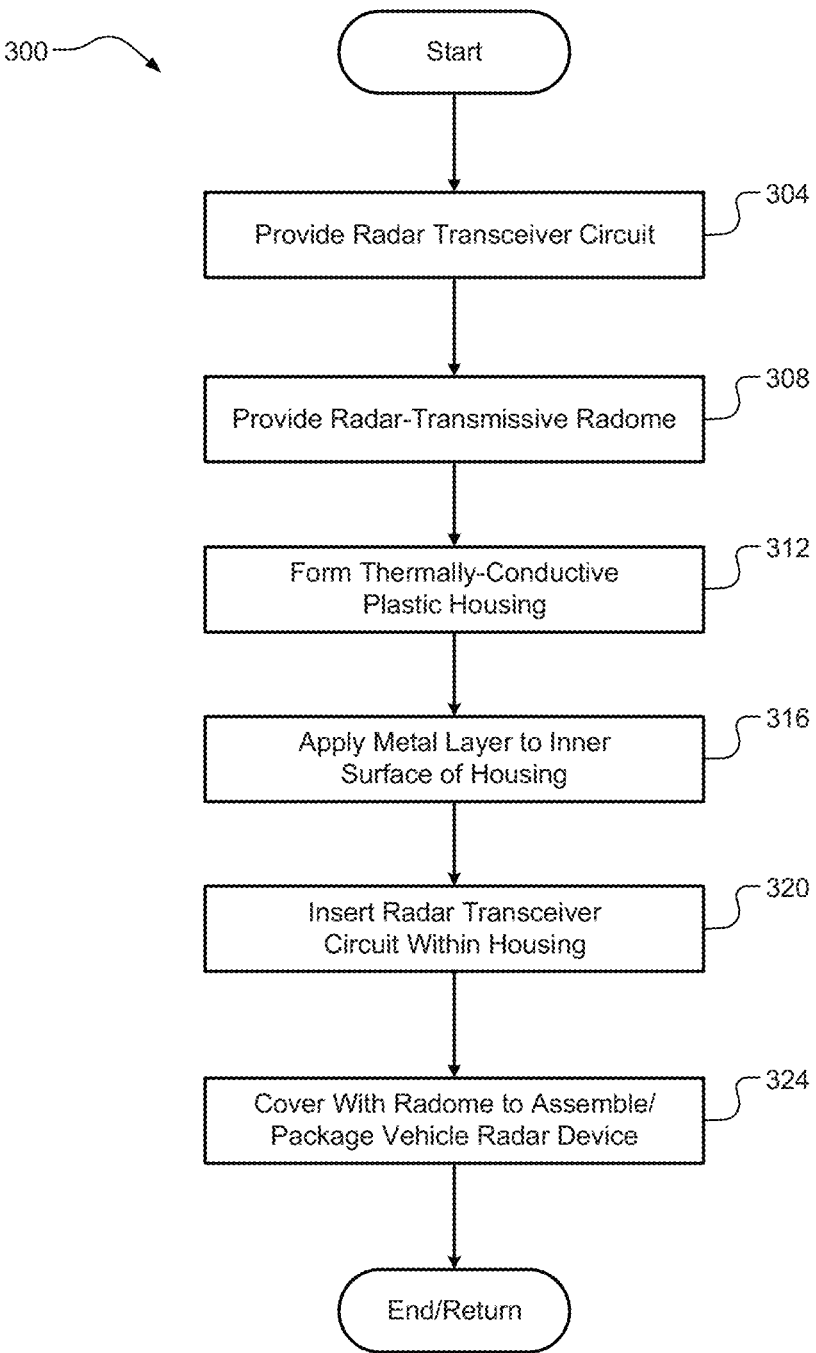
FIG. 3 is a flow diagram of an example method of manufacturing a vehicle radar device having improved thermal management and shielding according to some implementations of the present disclosure.

Referring now to FIG. 3, a flow diagram of another method 300 for manufacturing and assembling a vehicle radar device having improved thermal management and shielding according to some implementations of the present disclosure is illustrated. Again, while the method 300 references the vehicle radar device 104 and its components for illustrative/explanatory purposes, it will be appreciated that the manufacturing and assembly method 300 could be applicable to other suitable radar devices, including non-automotive radar devices (e.g., aviation, military, etc.). At 304, the radar transceiver circuit 108 is provided, which defines a surface topography 144 and a perimeter 148. As previously described, the radar transceiver circuit 108 could include an MMIC 116 and respective housing 120, with the MMIC 116 being electrically connected to a circuit board 124 (e.g., a PCB) via a set of electrical connections 128. At 308, the radar-transmissive (e.g., radar-transparent) radome 112 is provided. At 312, a thermally-conductive plastic material is injection molded in a mold to form the housing 132 configured to receive the radar transceiver circuit 108 and to provide shield grounding thereto.

The mold (not shown) is defined (i) based on the surface topography 144 of the radar transceiver circuit 108, (ii) to create a set of features for a mechanical bond of at least a perimeter 148 of the radar transceiver circuit 108 to the housing 132, and optionally (iii) to create at least one of (a) one or more pressure points in the housing 132 to increase flexibility and improve electrical contact with the radar transceiver circuit 108 and (b) one or more dimples 152 spaced apart from each other for shielding around the radar transceiver circuit 108. At 316, the metal layer 136 to the inner surface 140 of the housing 132 to provide for thermal spreading of heat energy generated by the radar transceiver circuit 108. As previously discussed, the metal layer 136 is a combination of different metals, such as (i) plated copper, followed by (ii) plated nickel, followed by (iii) vapor deposition of silver or aluminum. Finally, at 320 and 324, the radar transceiver circuit 108 is inserted into the housing 132 (e.g., including any necessary electrical connections) and the final part is assembled/packaged by a human installer, a robotic installer, or some combination thereof, including covering the housing 132 with the radome 116. This could include, for example, applying a force to seal the radar transceiver circuit 108 therein, such as with the assistance of the various feature(s) (e.g., housing features) described herein. The method 300 then ends or returns to 304 for one or more additional manufacturing and assembly cycles.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermal management and shielding system for a radar device of a vehicle, the radar device including a radar transceiver circuit and a radar-transmissive radome, the thermal management and shielding system comprising:
   a housing formed of a thermally-conductive plastic material and configured to (i) receive the radar transceiver circuit and (ii) provide shield grounding to the radar transceiver circuit; and
   a metal layer applied to an inner surface of the housing to provide for thermal spreading of heat energy generated by the radar transceiver circuit,
   wherein:
      the housing includes a first dimple and a second dimple on the inner surface spaced apart from each other and located underneath the radar transceiver circuit, and
      the metal layer includes a protrusion disposed in a space between the first dimple and the second dimple.

2. The thermal management and shielding system of claim 1, wherein the metal layer includes (i) copper, (ii) nickel, and (iii) silver or aluminum.

3. The thermal management and shielding system of claim 2, wherein the metal layer is a metalized film that is applied via a film deposition technique.

4. The thermal management and shielding system of claim 2, wherein the metal layer is formed by (i) plating copper, followed by (ii) plating nickel, followed by (iii) vapor deposition of silver or aluminum.

5. The thermal management and shielding system of claim 4, wherein the metal layer defines 1-10 microns of copper, 0.25 to 2.5 microns of nickel, and 1.0 micron of silver or aluminum.

6. The thermal management and shielding system of claim 1, wherein the thermally-conductive plastic material defines k-values of 15 watts per meter-Kelvin (W/mK) for in-plane (x/y axis) conductivity and 3.5 W/mK for out-plane/thickness (z-axis) conductivity.

7. The thermal management and shielding system of claim 1, wherein the housing is an injection molded housing formed by injection molding of the thermally-conductive plastic material in a mold and the mold is further defined based on a surface topography of the radar transceiver circuit.

8. The thermal management and shielding system of claim 7, wherein the radar transceiver circuit is packaged within the housing and then covered by the radar-transmissive radome thereby sealing the radar transceiver circuit therein.

9. A thermal management and shielding method for a radar device of a vehicle, the radar device having a radar transceiver circuit and a radar-transmissive radome, the thermal management and shielding method comprising:
   providing a housing formed of a thermally-conductive plastic material and configured to (i) receive the radar transceiver circuit and (ii) provide shield grounding to the radar transceiver circuit; and
   applying a metal layer to an inner surface of the housing to provide for thermal spreading of heat energy generated by the radar transceiver circuit, wherein:
      the housing includes a first dimple and a second dimple on the inner surface spaced apart from each other and located underneath the radar transceiver circuit,
      the metal layer includes a protrusion disposed in a space between the first dimple and the second dimple.

10. The thermal management and shielding method of claim 9, wherein the metal layer includes (i) copper, (ii) nickel, and (iii) silver or aluminum.

11. The thermal management and shielding method of claim 10, wherein the metal layer is a metalized film, and further comprising applying the metalized film via a film deposition technique.

12. The thermal management and shielding method of claim 11, wherein the metal layer is formed by (i) plating copper, followed by (ii) plating nickel, followed by (iii) vapor deposition of silver or aluminum.

13. The thermal management and shielding method of claim 12, wherein the metal layer defines 1-10 microns of copper, 0.25 to 2.5 microns of nickel, and 1.0 micron of silver or aluminum.

14. The thermal management and shielding method of claim 9, wherein the thermally-conductive plastic material defines k-values of 15 watts per meter-Kelvin (W/mK) for in-plane (x/y axis) conductivity and 3.5 W/mK for out-plane/thickness (z-axis) conductivity.

15. The thermal management and shielding method of claim 9, wherein the housing is an injection molded housing, and further comprising injection molding the thermally-conductive plastic material in a mold to form the housing, wherein the mold is further defined based on a surface topography of the radar transceiver circuit.

16. The thermal management and shielding method of claim 15, further comprising packaging the radar transceiver circuit in the housing and then covering the radar transceiver circuit with the radar-transmissive radome thereby sealing the radar transceiver circuit therein.

17. A method of manufacturing and assembling a radar device for a vehicle, the method comprising:
   providing a radar transceiver circuit defining a surface topography and a perimeter;
   providing a radar-transmissive radome configured to protect the radar transceiver circuit;
   injection molding a thermally-conductive plastic material in a mold to form a housing including a first dimple and a second dimple and configured to (i) receive the radar transceiver circuit and (ii) to provide shield grounding to the radar transceiver circuit, wherein the mold is defined:
      (i) based on the surface topography of the radar transceiver circuit, and
      (ii) to create the first dimple and the second dimple spaced apart from each other and located underneath the radar transceiver circuit;
   applying a metal layer to an inner surface of the housing to provide for thermal spreading of heat energy generated by the radar transceiver circuit, wherein the metal layer is formed by (i) plating copper, followed by (ii) plating nickel, followed by (iii) vapor deposition of silver or aluminum, wherein the metal layer includes a protrusion disposed in a space between the first dimple and the second dimple; and
   packaging the radar transceiver circuit within the housing and then covering the radar transceiver circuit with the radar-transmissive radome to form the radar device, wherein packaging the radar transceiver circuit is performed by at least one of: a human assembler, or a robotic assembler.

18. The method of claim 17, wherein:

the thermally-conductive plastic material defines k-values of 15 watts per meter-Kelvin (W/mK) for in-plane (x/y axis) conductivity and 3.5 W/mK for out-plane/thickness (z-axis) conductivity; and the metal layer defines 1-10 microns of copper, 0.25 to 2.5 microns of nickel, and 1.0 micron of silver or aluminum.

\* \* \* \* \*